(12) United States Patent
Jaramillo Isaza et al.

(10) Patent No.: US 11,205,735 B2
(45) Date of Patent: Dec. 21, 2021

(54) LOW TEMPERATURE P-I-N HYBRID MESOPOROUS OPTOELECTRONIC DEVICE

(71) Applicants: Universidad de Antioquia, Medellin (CO); Anhidridos y Derivados de Colombia S.A.—Andercol, Medellin (CO); SUMINISTROS DE COLOMBIA S.A.S., SUMICOL, Sabaneta (CO); Empresas Públicas de Medellín E.S.P., Medellin (CO)

(72) Inventors: Franklin Jaramillo Isaza, Medellín (CO); Daniel Estiben Ramirez Zora, Medellin (CO); Juan Felipe Montoya Arango, Medellin (CO)

(73) Assignees: Universidad de Antioquia, Medellin (CO); Anhidridos y Derivados de Colombia S.A.—Andercol, Medellin (CO); Suministros de Colombia S.A.S., SUMICOL, Sabaneta (CO); Empresas Publicas de Medellin, Medellin (CO)

(*) Notice: Subject to any disclaimer, the term of this patent is extended or adjusted under 35 U.S.C. 154(b) by 159 days.

(21) Appl. No.: 15/972,204

(22) Filed: May 6, 2018

(65) Prior Publication Data
US 2018/0323329 A1 Nov. 8, 2018

Related U.S. Application Data

(60) Provisional application No. 62/502,139, filed on May 5, 2017.

(51) Int. Cl.
*H01L 31/075* (2012.01)
*H01L 31/02* (2006.01)
(Continued)

(52) U.S. Cl.
CPC ...... *H01L 31/075* (2013.01); *H01L 31/02008* (2013.01); *H01L 31/022425* (2013.01);
(Continued)

(58) Field of Classification Search
CPC . H01L 31/075; H01L 31/0336; H01L 31/077; H01L 31/02008; H01L 31/032;
(Continued)

(56) References Cited

U.S. PATENT DOCUMENTS 9,305,715 B2   4/2016   Irwin et al.
9,318,270 B2   4/2016   Horiuchi et al.
(Continued)

FOREIGN PATENT DOCUMENTS

AU   2017268594   12/2017
WO   WO2017191265   11/2017

OTHER PUBLICATIONS

Kim et al. "High-Performance and Environmentally Stable Planar Heterojunction Perovskite Solar Cells Based on a Solution-Processed Copper-Doped Nickel Oxide Hole-Transporting Layer." Adv. Mater. 2015, 27, 695-701. Available online Nov. 29, 2014. (Year: 2014).*

(Continued)

*Primary Examiner* — Tae-Sik Kang
(74) *Attorney, Agent, or Firm* — The Morales Law Firm; Joseph L. Morales (57) ABSTRACT

Optoelectronic devices having an improved architecture are disclosed, such as p-i-n hybrid solar cells. These solar cells are characterized by including an insulating mesoporous scaffold in between the hole transportation layer and the photoactive layer, in such a way that the photoactive layer infiltrates the insulating mesoporous scaffold and contacts the hole transportation layer. The infiltration of the photoactive layer in the mesoporous scaffold improves the per- (Continued)

formance of the hole transportation layer and increases the photovoltaic performance of the solar cell. Solar cells, according to the present invention are manufactured in their entirety below 150° C. and present advantages in terms of cost and ease of manufacture, performance, and energy efficiency, stability over time and reproducibility.

16 Claims, 8 Drawing Sheets

(51) Int. Cl.
*H01L 31/032* (2006.01)
*H01L 51/00* (2006.01)
*H01L 31/0224* (2006.01)
*H01L 31/0336* (2006.01)
*H01L 51/42* (2006.01)
*H01L 31/077* (2012.01)
*H01L 31/0256* (2006.01)

(52) U.S. Cl.
CPC ........ *H01L 31/032* (2013.01); *H01L 31/0336* (2013.01); *H01L 31/077* (2013.01); *H01L 51/0037* (2013.01); *H01L 51/4246* (2013.01); *H01L 51/4293* (2013.01); *H01L 2031/0344* (2013.01)

(58) Field of Classification Search
CPC ......... H01L 31/022425; H01L 31/0344; H01L 51/4293; H01L 51/4246; H01L 51/0037; H01G 9/20–2095; Y02E 10/50–58
See application file for complete search history.

(56) References Cited

U.S. PATENT DOCUMENTS

| | | | |
|---|---|---|---|
| 9,614,169 | B2 | 4/2017 | Koposov et al. |
| 2015/0122314 | A1* | 5/2015 | Snaith ................ H01L 51/4213 136/255 |
| 2015/0129034 | A1* | 5/2015 | Snaith ................ H01L 51/4226 136/258 |
| 2015/0200377 | A1 | 7/2015 | Etgar et al. |
| 2016/0005986 | A1 | 1/2016 | Guo et al. |
| 2016/0126483 | A1 | 5/2016 | Kim et al. |
| 2016/0359119 | A1* | 12/2016 | Hayashi ............. H01L 51/4226 |
| 2017/0229250 | A1 | 8/2017 | Guo et al. |
| 2017/0287648 | A1 | 10/2017 | Wu et al. |
| 2017/0365418 | A1* | 12/2017 | Schumann .......... H01G 9/2059 |
| 2018/0005764 | A1 | 1/2018 | Jones et al. |

OTHER PUBLICATIONS

Fu F, et al., "High-efficiency inverted semi-transparent planar perovskite solar cells in substrate configuration", Nature Energy, Dec. 19, 2016, 2.1(2017): 16190, published online.

Choi, Hyosung, et al. "Conjugated polyelectrolyte hole transport layer for inverted-type perovskite solar cells", Nature Communications, Jun. 17, 2015, 6(2015): 7348, published online.

Mali, Sawanta S., Chang Kook Hong, "pin/nip type planar hybrid structure of highly efficient perovskite solar cells towards improved air stability: synthetic strategies and the role of p-type hole transport layer (HTL) and n-type electron transport layer (ETL) metal oxides", Nanoscale, Apr. 19, 2016, 8.20 (2016): 10528-10540, published online.

Chen, Lung-Chien, and Zong-Liang Tseng, "ZnO-based electron transporting layer for perovskite solar cells", Nanostructured Solar Cells, IntechOpen, Feb. 22, 2017, published online.

Cao, Jie, et al., "Low-temperature solution-processed NiO x films for air-stable perovskite solar cells", Journal of Materials Chemistry A, May 4, 2017, 5.22 (2017): 11071-11077, published online.

* cited by examiner

LOW TEMPERATURE P-I-N HYBRID MESOPOROUS OPTOELECTRONIC DEVICE

CROSS-REFERENCE TO RELATED APPLICATIONS

This application claims the priority benefit under 35 U.S.C. § 119(e) of U.S. Provisional patent application Ser. No. 62/502,139 filed on May 5, 2017, and entitled "Sub 150° C. P-i-N Mesoporous Optoelectronic Device with Improved Performance Stability and Reproducibility"; which is incorporated herein by reference in its entirety.

BACKGROUND OF THE INVENTION

1. Field of the Invention

The present disclosure relates to photovoltaic optoelectronic devices such as solar cells.

2. Prior Art Description

Optoelectronic devices are transducers that convert optical signals into electronic signals or vice versa. A subset of the optoelectronic devices are the photovoltaic devices of which photovoltaic cells, or solar cells, are the largest representatives. These solar cells harvest energy from sunlight and transform it into electrical energy which is used to feed a wide range of devices.

Solar cell operation is based on the photovoltaic effect which consists on the production of an electron-hole pair when a photon reaches a photoactive material. In the presence of an electric field, which can be produced by a difference in concentration of charge carriers in the bands of the semiconductor material, the electrons and holes are separated and transported to different electrical contacts (electrodes) generating electrical power which is subsequently consumed or stored.

Commonly, solar cells are constructed as a stack of layers arranged between two electrodes. The stack of layers comprises an n-type material acting as an electron transportation layer, a light-absorbing material typically referred to as photoactive material, and a p-type material acting as hole transportation layer.

It has been found that by using organic or hybrid compounds as photoactive materials, low cost manufacturing methods such as solution-based processing can be introduced which is adaptable to large scale production and low energy consumption, compared to device processing methods based solely on inorganic semiconductors. Solar cells combining organic and inorganic materials are known as hybrid solar cells.

Additionally, the use of compounds with perovskite structure as light-absorbing materials has rapidly increased the efficiency of solar cells compared to other types of solar cells such as those based on thin films.

Likewise, one way to control the solar cell performance is to include an intrinsic material (i) between the n-type material and the p-type material. The region i need not be truly intrinsic as long as it has a high resistivity. As a consensus, the order in which the materials are deposited determines the type of solar cell structure. If the n-type material is deposited on top of the semitransparent electrode and then the intrinsic material and p-type, the structure is referred to as n-i-p. On the other hand, if the p-type material is first deposited on top of the semitransparent electrode, and subsequently the intrinsic material and the n-type material, the structure is referred to as p-i-n. Certain aspects depend on the type of structure such as the materials that can be used and the manufacturing conditions.

For example, a common configuration for n-i-p solar cells is $TiO_2$/perovskite/Spiro. Since $TiO_2$ processing requires a sintering step to temperatures above 500° C., manufacturing the p-i-n structure Spiro-MeOTAD/perovskite/$TiO_2$ is not possible because the deposition of $TiO_2$ would deteriorate the perovskite and the Spiro-MeOTAD. Consequently, traditional solar cell architectures not only require manufacturing methods at high temperatures, which implies high costs and long production times, but also does not allow architectures other than n-i-p. Likewise, it is difficult to ensure high controllability of the methods based on manufacturing at high temperatures, which results in a lower reproducibility of the devices produced by these methods.

Solar cells manufacture at the industrial level depends, to a great extent, on the deposition methods of films, the conditions that they require, and on the stability and reproducibility of the devices. Solar cells production at low temperatures is desirable due to cost reduction and short manufacturing times, since these can provide greater versatility in the type of materials that can be used and provide the control of manufacturing conditions, which leads to improved reproducibility of the devices.

Thus, there is a need in the art to combine solar cells production at low temperatures with high stability and reproducibility, maintaining a good performance thereof.

SUMMARY

The present disclosure is a response to the needs of the art, and relates to improved architecture optoelectronic devices that may be completely processed at temperatures below 150° C. P-i-n hybrid solar cells that include an insulating mesoporous scaffold between the hole transportation layer and the photoactive layer are disclosed herein. The photoactive layer infiltrates the insulating mesoporous scaffold so as to contact the hole transportation layer through said insulating mesoporous scaffold.

Surprisingly, it was found that arranging the photoactive layer on the mesoporous scaffold increases the solar cell photovoltaic performance, further providing improved stability over time and reproducibility in manufacturing.

DETAILED DESCRIPTION OF THE PREFERRED EMBODIMENTS

It is understood that the invention is not limited to the embodiments described herein, nor its implementation to the disclosures made in this Specification or in the illustrations. The invention considers other embodiments and applications, and the exemplary representations intend to explain the invention and should not be considered as limiting. Likewise, the terminology used herein aims to describe the invention in a clear fashion and should not be consider as limiting.

The present disclosure meets the needs in the industry mentioned above and lies the foundations for manufacturing the optoelectronic devices at low temperature with improved energy efficiency and temporal stability. Also, the present invention facilitates the production of said devices, reducing costs and time related with the manufacturing thereof.

An optoelectronic device (100) having an improved architecture, such as p-i-n hybrid solar cells that may be rigid or flexible is disclosed herein. Solar cells constructed according with the architecture disclosed herein are stable, of large surface and highly reproducible. Solar cells according to the present invention are developed in their entirety at low temperature, preferably below 150° C. According to the present invention, the improved architecture has an insulating mesoporous material layer (200) acting as an interface between a hole transportation layer (410) and a photoactive layer (300), with which the photovoltaic efficiency of the device is improved.

Figure 1:
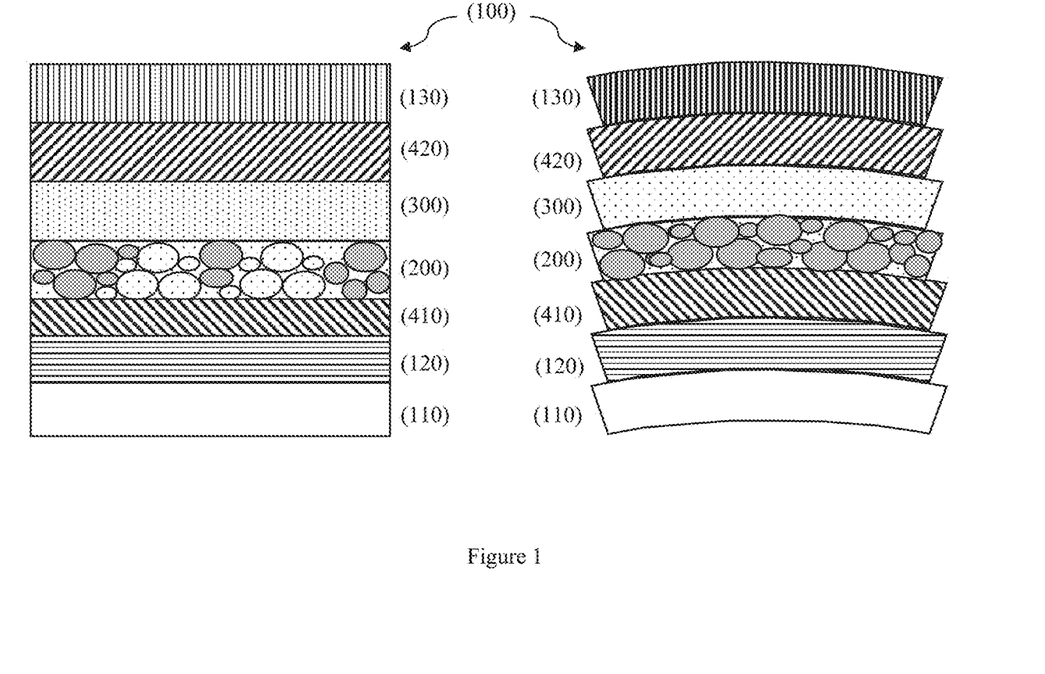
FIG. 1 displays the solar cell basic structure disclosed herein constructed both in a rigid substrate (left) and in a flexible substrate (right).

FIG. 1 displays the solar cell basic structure according to the present invention for a rigid substrate (left) and a flexible substrate (right). The architecture of solar cells disclosed herein consists of a multilayer structure comprising a substrate (110), a first electrode (120), a hole transportation layer (410), an insulating mesoporous scaffold (200), a photoactive layer (300), an electron transportation layer (420), and a second electrode (130).

According to the present disclosure, the photoactive layer (300) is infiltrated in the insulating mesoporous scaffold (200) in such a way that it contacts the hole transportation layer (410). Including a mesoporous scaffold (200) through which the photoactive material (300) may contact the hole transportation layer (410) provides the present development with a better performance in terms of energy conversion, a higher reproducibility and scalability of solar cells, and a higher temporal stability thereof. Likewise, the insulating mesoporous scaffold (200) strengthens the synergistic effect between the hole transportation layer (410) and the photoactive layer (300).

According with this disclosure, a substrate (110) is made from a rigid or flexible material. In preferred embodiments, the substrate (110) is a material commonly used in the art such as a glass or a polymer selected from the group comprising: Polyethylene terephthalate (PET), and Polyethylene naphthalate (PEN), among others.

On the other hand, a first electrode (120) and a second electrode (130) constitute, respectively, the cathode and anode of the device (100), and act as the transportation paths of charge carriers outwards the device (100). A preferred embodiment of the invention considers that the first electrode (120) and the second electrode (130) may be transparent or semi-transparent, allowing light transmission therebetween. Further, the electrodes may have a grid-like structure in such a way that, even when the electrodes are opaque, the light may reach the semi-conducting layers through the gaps not covered by them.

According to the present disclosure, the hole transportation layer (410) consists of a p-type material arranged on the first electrode (120). When light falls on the device (100), holes that are generated in the depletion region are attracted to the p-type material and directed to the cathode, thus producing an electric current. According to embodiments of the present disclosure, the p-type material is a metal oxide, preferably, a transition metal oxide. In a preferred embodiment the p-type material is a nickel oxide $NiO_x$, or a nickel oxide $NiO_x$ doped with another metal such as copper, lithium or silver.

In further embodiments, the p-type material constituting the hole transportation layer (410) is an organic polymer such as poly(3,4-ethylenedioxythiophene) polystyrene sulfonate (PEDOT:PSS) or Spiro-OMeTAD.

According to the present disclosure, an insulating mesoporous scaffold (200) is deposited over the p-type material (410) which is coupled to the p-type material (410) so as to favor hole transportation. The insulating mesoporous scaffold (200) is selected from the group comprising insulating materials, preferentially metal oxides and metal carbonates. Still more preferentially, the mesoporous scaffold is selected from the group comprising: $ZrO_2$, $Al_2O_3$, $CaCO_3$ and combinations thereof.

Figure 2:
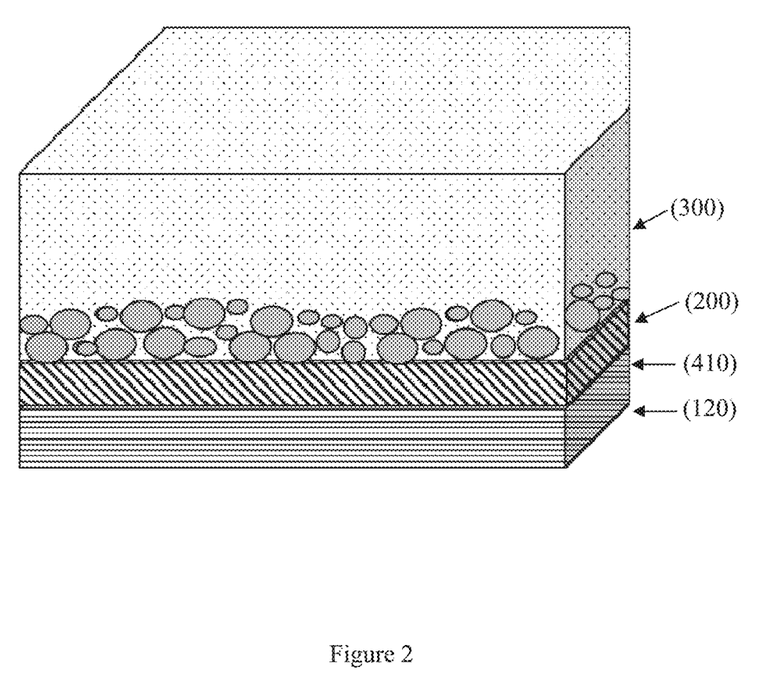
FIG. 2 displays a non-limiting embodiment disclosed herein of the infiltration of the photoactive layer (300) in the insulating mesoporous scaffold (200).
Figure 3A:
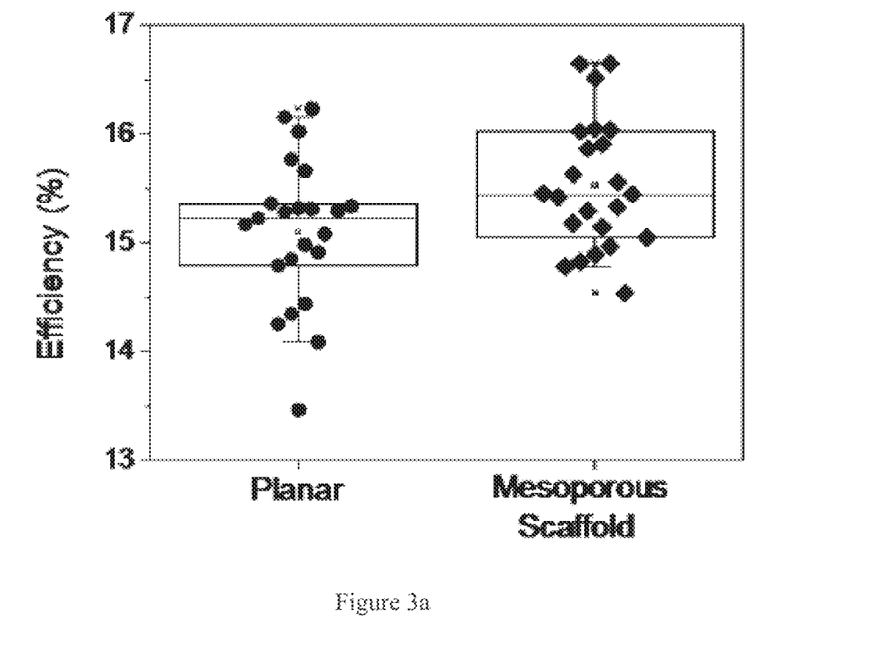
FIG. 3*a* displays the Photovoltaic Conversion Efficiency of a device with the architecture disclosed herein which includes an insulating mesoporous scaffold in comparison with a device that does not include it.
Figure 3B:
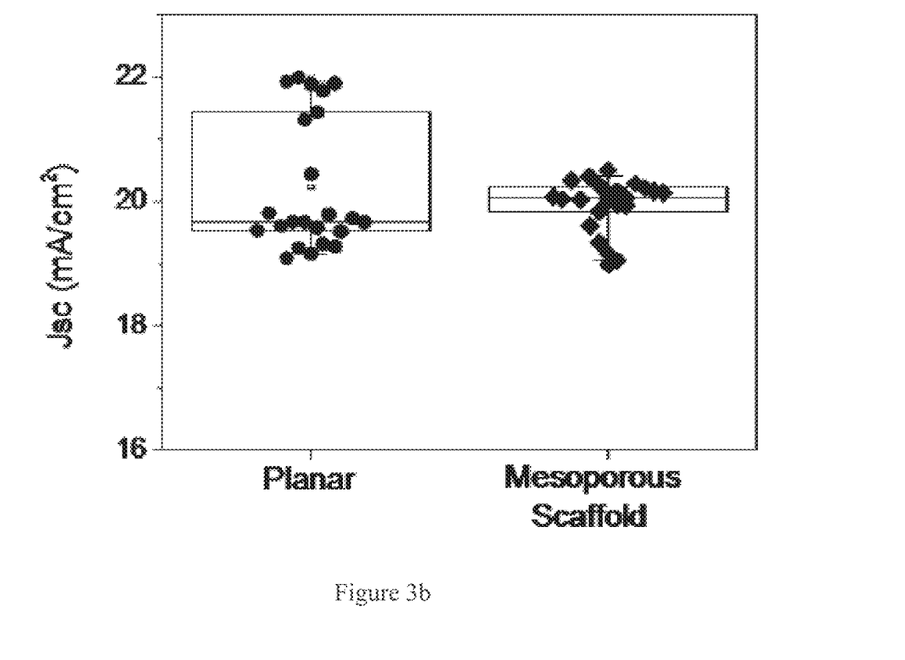
FIG. 3*b* corresponds to a comparison of the current density generated in a device disclosed herein with respect to a device that does not include a mesoporous scaffold.
Figure 3C:
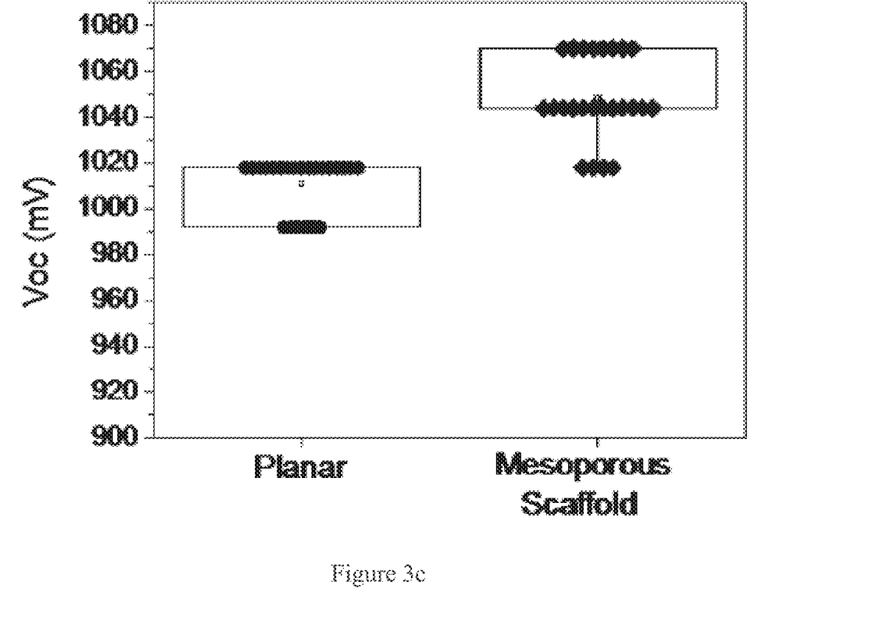
FIG. 3*c* shows the open-circuit voltage of the device disclosed herein and of a conventional architecture device.
Figure 3D:
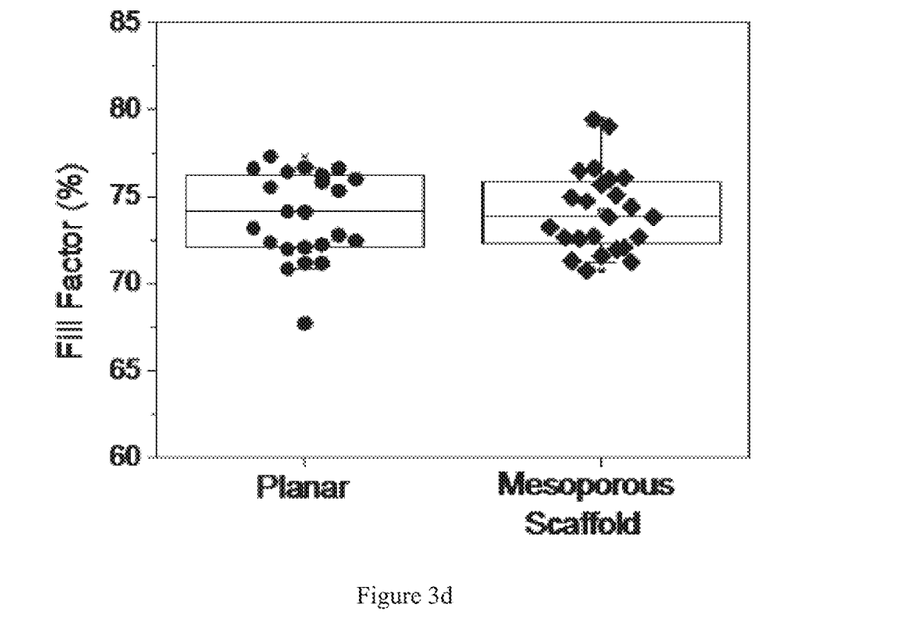
FIG. 3*d* displays the fill factor of the device according to the present disclosure in comparison with a device that does not include a mesoporous scaffold.

Insulating mesoporous scaffold (200) acts as interface between the hole transportation layer (410) and the photoactive layer (300). Once the mesoporous scaffold (200) is placed on the hole transportation layer (410), the photoactive layer (300) is deposited which is infiltrated into the insulating mesoporous scaffold (200) in such a way that, through the latter, may contact the hole transportation layer (410). FIG. 2 shows a non-limiting embodiment according to the invention in which the photoactive layer (300) crystallizes in the mesoporous scaffold (200) until it reaches the hole transportation layer (410). Preferably, the insulating mesoporous scaffold (200) thickness is between 50 nm and 500 nm.

On the other hand, according to a preferred embodiment of the present invention, the photoactive layer (300) has a perovskite $AMX_3$ structure, wherein A corresponds to cations of alkylamine ($C_1$-$C_8$) or alkali metals; M is a metal; and X is a halogen. In yet more preferred embodiments of the invention, A is selected from the group consisting of $CH_3NH_3$, $CH(NH_2)_2$ and Cs; M is selected from Pb, Sn, Ni, Co; and X is selected from Cl, Br, I.

In other embodiments according to the present disclosure, the photoactive layer (300) has a 2D perovskite structure. Preferentially, the photoactive layer (300) has a Ruddlesden-Popper hybrid perovskite structure, and still more preferentially, of the $A_2B_2M_3X_{10}$ type, wherein A corresponds to cations of alkylamine ($C_1$-$C_8$) or alkali metals, particularly, A is selected from the group comprising $CH_3NH_3$, $CH(NH_2)_2$, Cs; B is an amino iodide, which in certain embodiments is selected from the group comprising $C_3H_{10}IN$, $C_4H_{12}IN$ and $C_7H_{10}IN$; M is a metal selected from Pb, Sn, Ni, Co; and X is halogen, for example, selected from Cl, Br and I.

In other preferred embodiments, the photoactive layer (300) is a compound of inorganic perovskite. According to these preferred embodiments, the photoactive layer (300) is selected from the group comprising: $Cs_2SnI_6$, $Cs_2PbBr_6$, $Rb_2AgInBr_6$, $Cs_2BiAgBr_6$, $Cs_2BiAgCl_6$ and derivatives thereof.

According to the architecture disclosed in the present invention, an electron transportation layer (420) is deposited over the photoactive layer (300). The electron transportation layer (420) consists of an n-type material, above which, subsequently, a second electrode (130) is arranged. When light falls on the device, the electrons that are generated in the depletion region are attracted to the n-type material and directed to the anode, thus producing an electric current. According to the present invention, the n-type material corresponds to materials commonly used in the art. Thus, in preferred embodiments of the present invention, the n-type material of the electron transportation layer (420) is selected from the group comprising: Phenyl-C61-butyric acid-methyl-ester (PCBM), $C_{60}$ or a transition metal oxide such as titanium oxide ($TiO_2$) or tin oxide ($SnO_2$).

Surprisingly, the inclusion of the insulating mesoporous scaffold (200) as an interface between the hole transportation layer (410) and the photoactive layer (300) according to the architecture disclosed herein improves the performance of the cell. Such better performance is clear in FIGS. 3a, 3b, 3c and 3d.

Figure 4:
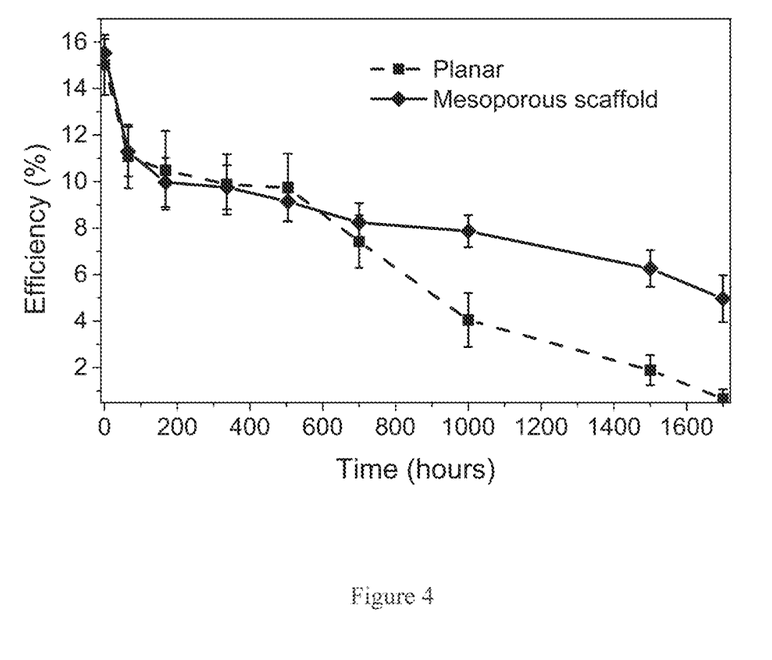
FIG. 4 corresponds to the efficiency with respect to time of the device in the disclosure and one from the prior art.

In addition, the insulating mesoporous scaffold (200) according to the architecture of the present disclosure provides the device (100) with greater stability with respect to time, slowing down the device degradation which results in a longer useful life. FIG. 4 shows the efficiency with respect to time of a solar cell according to the invention in comparison with a conventional planar cell having no insulating mesoporous scaffold. Said FIG. 4 shows how during the first 600 hours of operation of the device, the cell efficiency that includes the architecture of the invention is similar to that of the cell having no mesoporous scaffold (200) but, after 600 hours, the structure with the mesoporous scaffold (200) presents superior efficiency almost twice greater.

Figure 5A:
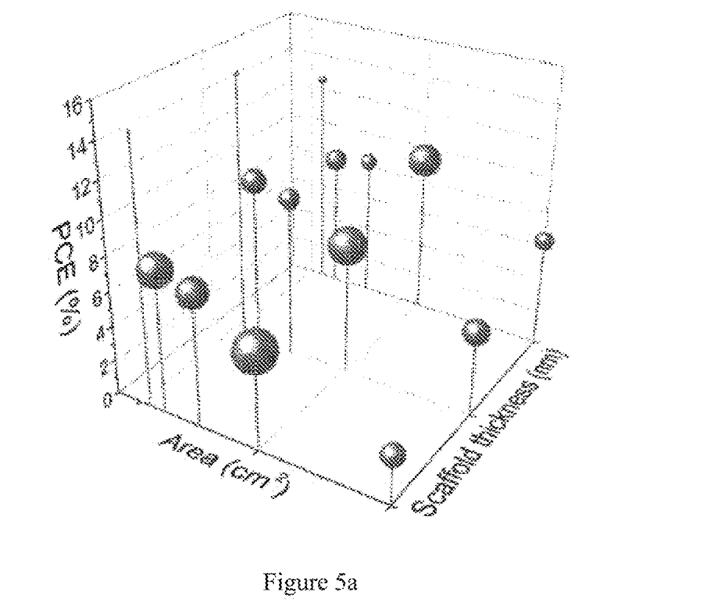
FIG. 5a demonstrates that the insulating mesoporous scaffold hinders the negative effect of the increase in the cell active area on the Photovoltaic conversion efficiency of the solar cells.
Figure 5B:
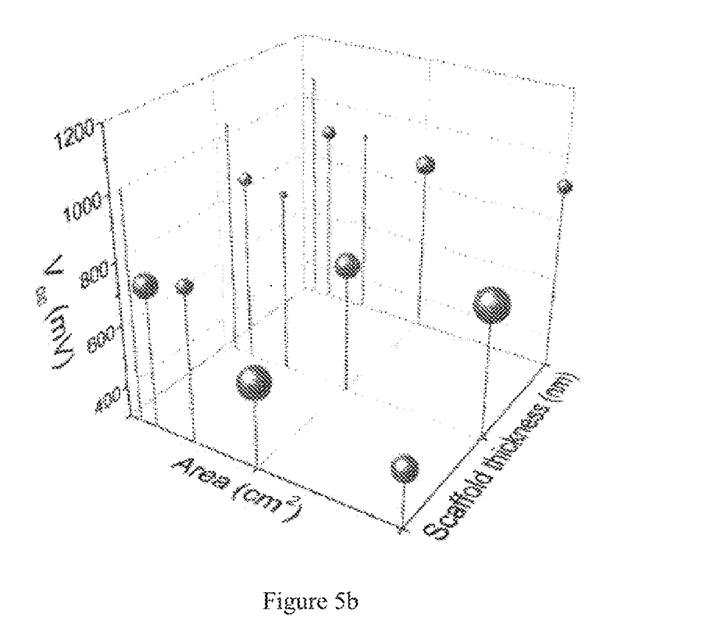
FIG. 5b demonstrates that the insulating mesoporous scaffold hinders the negative effect of the increase in the cell active area on the Open Circuit Voltage of the solar cells.
Figure 5C:
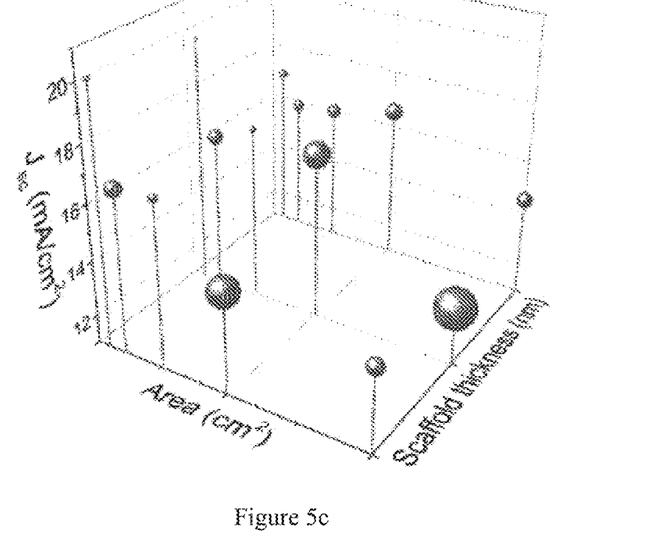
FIG. 5c demonstrates that the insulating mesoporous scaffold hinders the negative effect of the increase in the cell active area on the Current Density of the solar cells.
Figure 5D:
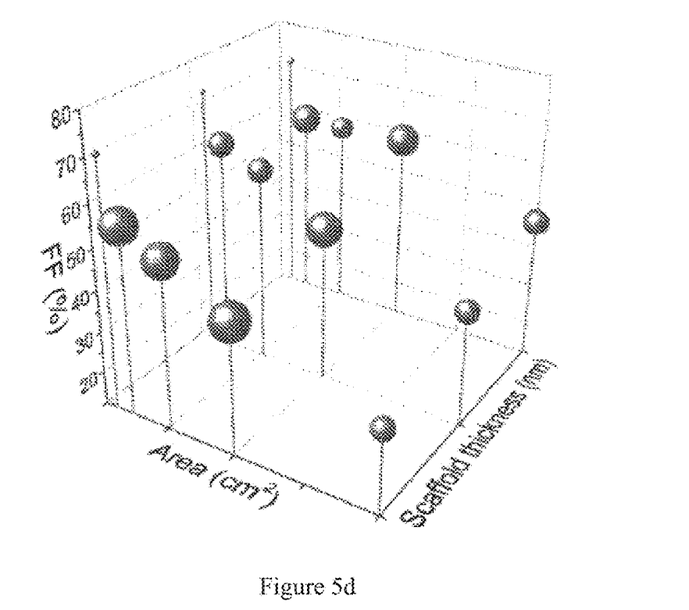
FIG. 5d demonstrates that the insulating mesoporous scaffold hinders the negative effect of the increase in the cell active area on the Fill Factor of the solar cells.

Likewise, the improved architecture of the present disclosure provides an improved scalability of the device (100), allowing to manufacture solar cells of greater active area without harming the photovoltaic performance. FIGS. 5a, 5b, 5c, 5d shows how an increase in the thickness of the insulating mesoporous scaffold (200) attenuates the negative effect that the increase of the surface area has on the Photovoltaic Conversion Efficiency (FIG. 5a), the open-circuit voltage (FIG. 5c), the short circuit current (FIG. 5c) and the fill factor of solar cells (FIG. 5d).

Figure 6A:
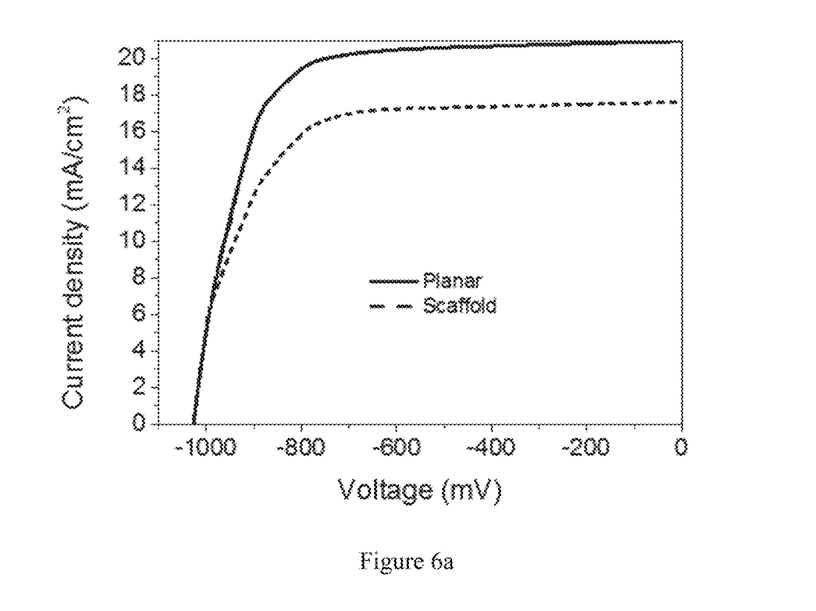
FIG. 6a displays the current density with respect to voltage applied (I-V curve) of a solar cell in rigid substrate according to the present disclosure and a conventional one.
Figure 6B:
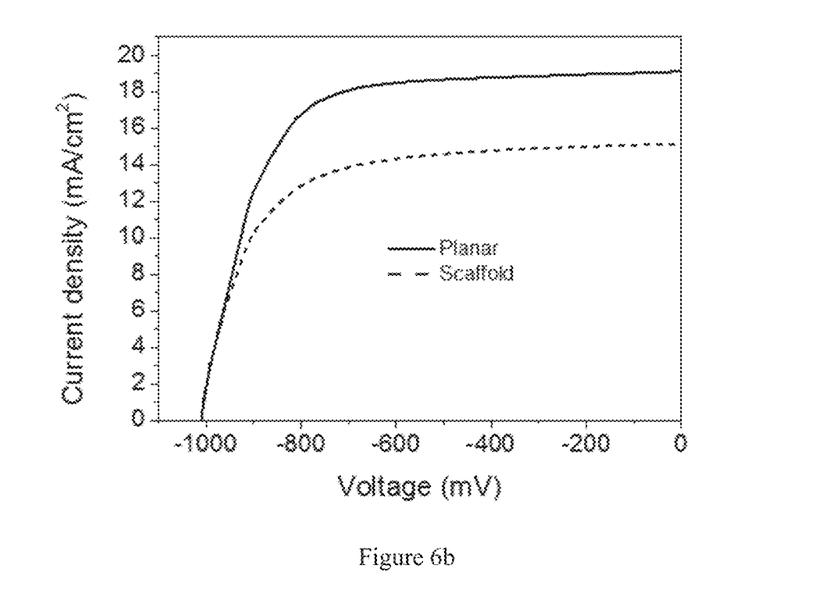
FIG. 6b corresponds to the current density with respect to applied voltage (I-V curve) of a solar cell in flexible substrate according to the present disclosure and a conventional one.

On the other hand, the inclusion of the insulating mesoporous scaffold (200) according to the architecture of the present disclosure favors the increase of the photovoltaic performance of the solar cells. FIG. 6a displays that the insulating mesoporous scaffold (200) increases the open circuit voltage of a solar cell with a rigid substrate (110) with respect to a conventional planar cell. Likewise, FIG. 6b displays that the insulating mesoporous scaffold (200) increases the current density and open circuit voltage of a solar cell with a flexible substrate (110) with respect to a conventional planar cell.

The intrinsic performance of the perovskite compound constituent of the photoactive layer (300), also presents improvements attributable to the insulating mesoporous scaffold (200). Typically, the manufacture of perovskites results in the uncontrolled emergence of pinholes in the structure. These pinholes have a negative impact in solar cells efficiency and reproducibility due to the fact that they may cause a direct contact (short circuit) between the electron transportation layer (420) and hole transportation layer (410), thus resulting in a voltage drop generated by the solar cell. Contrary to this, the presence of the insulating mesoporous scaffold (200) in the p-i-n structure reduces the density of pinholes in the perovskite, thus preventing short circuits.

Since the photoactive layer (300) is infiltrated in the insulating mesoporous scaffold (200), the perovskite contacts the hole transportation layer (410). This contact makes the perovskite p-type character increase, i.e., the hole density in the photoactive layer/hole transportation layer interface increases. Accordingly, the concentration gradient of charge carriers increases, thus favoring the generated voltage and increasing the electrical power delivered by the solar cell, which becomes into higher efficiency of the solar cell.

The p-i-n structure proposed according to the present invention allows the manufacture of the solar cell to be carried out in its entirety at low temperature, particularly below 150° C.

Likewise, the present architecture reduces manufacturing times, and, by requiring significantly lower temperatures than other architectures, the costs associated with solar cells production are reduced.

The fabrication process of each of the layers comprised by the device of the invention can be carried out by known coating methods such as evaporation, chemical vapor deposition, sputtering, spin-coating, spray-coating, Dr. Blade (tape casting) or roll-to-roll, all which can be carried out at temperatures below 150° C.

The invention claimed is:
1. A p-i-n optoelectronic device comprising:
 a transparent first electrode working as cathode, which allows light transmission into the device;
 a hole transport layer arranged on the transparent first electrode;
 an insulating mesoporous scaffold deposited on the hole transport layer;
 a photoactive capping layer with perovskite structure deposited on the insulating mesoporous scaffold, the photoactive capping layer capping the insulating mesoporous scaffold;
 an electron transport layer deposited on the photoactive capping layer;
 a second electrode working as anode, arranged on the electron transport layer;
 wherein:
 the insulating mesoporous scaffold acts as interface between the hole transport layer and the photoactive capping layer, and
 the photoactive capping layer contacts the hole transport layer through the insulating mesoporous scaffold.

2. The optoelectronic device according to claim 1, wherein the device is manufactured in its entirety below 150° C.

3. The optoelectronic device according to claim 1, wherein the insulating mesoporous scaffold comprises metal oxides or metal carbonates.

4. The optoelectronic device according to claim 3, wherein the insulating mesoporous scaffold comprises any of $ZrO_2$, $Al_2O_3$, $CaCO_3$ or combinations thereof.

5. The optoelectronic device according to claim 1, wherein the hole transport layer is a transition metal oxide.

6. The optoelectronic device according to claim 5, wherein the hole transport layer is doped with a metal comprising any of copper, lithium, or silver.

7. The optoelectronic device according to claim 1, wherein the hole transport layer is $NiO_x$, or $NiO_x$ doped with copper, lithium, or silver.

8. The optoelectronic device according to claim 1, wherein the hole transport layer is an organic polymer.

9. The optoelectronic device according to claim 8, wherein the hole transport layer is selected from poly(3,4-ethylenedioxythiophene):polystyrene sulfonate (PEDOT:PSS) and Spiro-OMeTAD.

10. The optoelectronic device according to claim 1, wherein the electron transport layer comprises any of $PC_{60}BM$, $PC_{70}BM$, $TiO_2$, $SnO_2$ or ZnO.

11. The optoelectronic device according to claim 1, wherein the photoactive layer has an $AMX_3$ structure, wherein:

A=cations of alkylamine $C_1$-$C_8$ or alkali metals;
M=a metal; and
X=a halogen.

12. The optoelectronic device according to claim 11, wherein
A=$CH_3NH_3$, $CH(NH_2)_2$, Cs;
M=Pb, Sn, Ni, Co; and
X=Cl, Br, I.

13. The optoelectronic device according to claim 1, wherein the photoactive layer is $A_2B_2M_3X_{10}$, wherein:
A=cations of alkylamine $C_1$-$C_8$ or alkali metals;
B=an amine iodide;
M=a metal; and
X=a halogen.

14. The optoelectronic device according to claim 13, wherein the photoactive layer is $A_2B_2M_3X_{10}$, wherein:
A=$CH_3NH_3$, $CH(NH_2)_2$, Cs;
B=$C_3H_{10}IN$, $C_4H_{12}IN$, $C_7H_{10}IN$;
M=Pb, Sn, Ni, Co; and
X=Cl, Br, I.

15. The optoelectronic device according to claim 1, wherein the photoactive layer is an inorganic perovskite.

16. The optoelectronic device according to claim 15, wherein the photoactive layer is selected from the group comprising $Cs_2SnI_6$, $Cs_2PbBr_6$, $Rb_2AgInBr_6$, $Cs_2BiAgBr_6$, $Cs_2BiAgC_{16}$ and derivatives thereof.

* * * * *